United States Patent
Chaung et al.

(10) Patent No.: US 8,825,978 B2
(45) Date of Patent: Sep. 2, 2014

(54) MEMORY APPARATUS

(75) Inventors: Yu-Meng Chaung, Taoyuan (TW); Chun-Hsiung Hung, Hsinchu (TW); Kuen-Long Chang, Taipei (TW); Ken-Hui Chen, Hsin Chu (TW); Nai-Ping Kuo, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 198 days.

(21) Appl. No.: 13/584,393

(22) Filed: Aug. 13, 2012

(65) Prior Publication Data

US 2013/0326184 A1    Dec. 5, 2013

Related U.S. Application Data

(60) Provisional application No. 61/654,973, filed on Jun. 4, 2012.

(51) Int. Cl.
  *G06F 12/00* (2006.01)
  *G06F 13/42* (2006.01)
  *G11C 29/00* (2006.01)

(52) U.S. Cl.
  USPC ............ 711/167; 711/154; 711/E12.001; 710/58; 710/110; 714/731; 714/E11.145

(58) Field of Classification Search
  None
  See application file for complete search history.

(56) References Cited

U.S. PATENT DOCUMENTS

| | | | | |
|---|---|---|---|---|
| 5,689,502 A * | 11/1997 | Scott | ............ | 455/466 |
| 6,442,644 B1 * | 8/2002 | Gustavson et al. | ............ | 711/105 |
| 6,952,462 B2 * | 10/2005 | Harrison | ............ | 375/373 |
| 7,170,819 B2 * | 1/2007 | Szczypinski | ............ | 365/194 |
| 7,646,835 B1 * | 1/2010 | Rozas | ............ | 714/769 |
| 7,864,624 B2 * | 1/2011 | Kim et al. | ............ | 365/191 |
| 8,010,724 B2 * | 8/2011 | Wortham et al. | ............ | 710/110 |
| 8,234,422 B2 * | 7/2012 | Linam et al. | ............ | 710/52 |
| 8,250,297 B2 * | 8/2012 | Gillingham et al. | ............ | 711/105 |
| 2001/0039632 A1 * | 11/2001 | MacLaren et al. | ............ | 714/6 |
| 2002/0157031 A1 * | 10/2002 | Lin | ............ | 713/401 |
| 2003/0126356 A1 * | 7/2003 | Gustavson et al. | ............ | 711/105 |
| 2005/0058234 A1 * | 3/2005 | Stojanovic | ............ | 375/371 |
| 2006/0056244 A1 * | 3/2006 | Ware | ............ | 365/194 |
| 2008/0294855 A1 * | 11/2008 | Chen et al. | ............ | 711/154 |
| 2009/0040846 A1 * | 2/2009 | Chang | ............ | 365/194 |
| 2010/0271092 A1 * | 10/2010 | Zerbe et al. | ............ | 327/161 |
| 2011/0208989 A1 * | 8/2011 | Nygren et al. | ............ | 713/501 |
| 2011/0228619 A1 * | 9/2011 | Iwasaki | ............ | 365/193 |
| 2012/0254873 A1 * | 10/2012 | Bringivijayaraghavan | ... | 718/102 |
| 2012/0321002 A1 * | 12/2012 | Akita | ............ | 375/259 |
| 2013/0024916 A1 * | 1/2013 | Evans | ............ | 726/3 |

* cited by examiner

*Primary Examiner* — Matthew Bradley
*Assistant Examiner* — Daniel Bernard
(74) *Attorney, Agent, or Firm* — McClure, Qualey & Rodack, LLP

(57) ABSTRACT

A memory apparatus includes a host device and a slave device. The host device stores verification data. The slave device includes a memory unit, a control unit, and a logic unit. The control unit drives the memory unit to provide storage data in a data transmission sub-period, and further provides a control signal, indicating the first verification data, in a dummy sub-period. The logic unit provides first preamble data, indicating substantially a same data value as the verification data, in the dummy sub-period in response to the first control signal. The preamble data and the storage data are transmitted according to an internal clock signal. The host device samples the first preamble data according to an external clock signal, and determines whether the external and the internal clock signals are synchronized by comparing the first preamble data and the first verification data.

20 Claims, 3 Drawing Sheets

| CMD_1 | 0 | | 1 | |
|---|---|---|---|---|
| CMD_2 | 0 | 1 | 0 | 1 |
| D7-D0 | 10101010 | 11001100 | 01010101 | 00110011 |

MEMORY APPARATUS

This application claims the benefit of U.S. provisional application Ser. No. 61/654,973, filed Jun. 4, 2012, the subject matter of which is incorporated herein by reference.

BACKGROUND OF THE INVENTION

1. Field of the Invention

The invention relates in general to a memory apparatus, and more particularly to a memory apparatus capable of achieving timing synchronization of internal and external clock signals in a dummy sub-period.

2. Description of the Related Art

In the present age, non-volatile memory devices have become more popular for use in various electronic devices. For example, flash memory is one of the most popular non-volatile semiconductor memories applied in the present age. Generally, operation commands, access addresses, and access data are transmitted between a host device and a memory device, so as to achieve access operation of the memory device by the host device. In order to make sure that the transmitted access data can be properly obtained by the host device, a sampling clock signal of the host device has to be properly synchronized with the transmission of the access data transmitted between the host device and the memory device.

However, how to provide a decent synchronization scheme capable of having the sampling clock signal of the host device synchronized with the data transmission has became a prominent object of the invention.

SUMMARY OF THE INVENTION

According to a first aspect of the invention, a memory apparatus, operating in a first read operation period including a first command sub-period, a first dummy sub-period, and a first data transmission sub-period, is provided. The memory apparatus includes a host device and a slave device. The host device stores first verification data and provides a first command indicating the first verification data. The slave device includes a memory unit, a control unit, a logic unit, and an output unit. The control unit receives the first command in the first command sub-period, drives the memory unit to provide first storage data in the first data transmission sub-period, and further provides a first control signal in the first dummy sub-period, wherein the first control signal indicates the first verification data. The logic unit provides first preamble data, indicating substantially a same data value as the first verification data, in the first dummy sub-period in response to the first control signal. The output unit receives the first preamble data and the first storage data, and further outputs the first preamble data and the first storage data according to an internal clock signal. The host device samples the first preamble data according to an external clock signal, and determines whether the external clock signal is substantially aligned with data valid-intervals determined by the internal clock signal by comparing the first preamble data and the first verification data.

According to a second aspect of the invention, a memory access method, applied on a memory apparatus operating in a first read operation period including a first command sub-period, a first dummy sub-period, and a first data transmission sub-period, is provided. A host device of the memory apparatus stores first verification data and provides a first command indicating the first verification data. The memory access method comprises the follow steps. The first command is received by a control unit of a slave device in the first command sub-period. A memory unit of the slave device is driven to provide first storage data in the first data transmission sub-period by the control unit. A first control signal, indicating the first verification data, is provided in the first dummy sub-period, by the control unit. First preamble data, indicating substantially a same data value as the first verification data, is provided in the first dummy sub-period in response to the first control signal, by a logic unit of the slave device. The first preamble data and the first storage data, are received and accordingly outputted according to an internal clock signal, by an output unit of the slave device. The first preamble data are sampled according to an external clock signal by the host device, and whether the external clock signal is substantially aligned with data valid-intervals determined by the internal clock signal by comparing the first preamble data and the first verification data, are determined by the host device.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
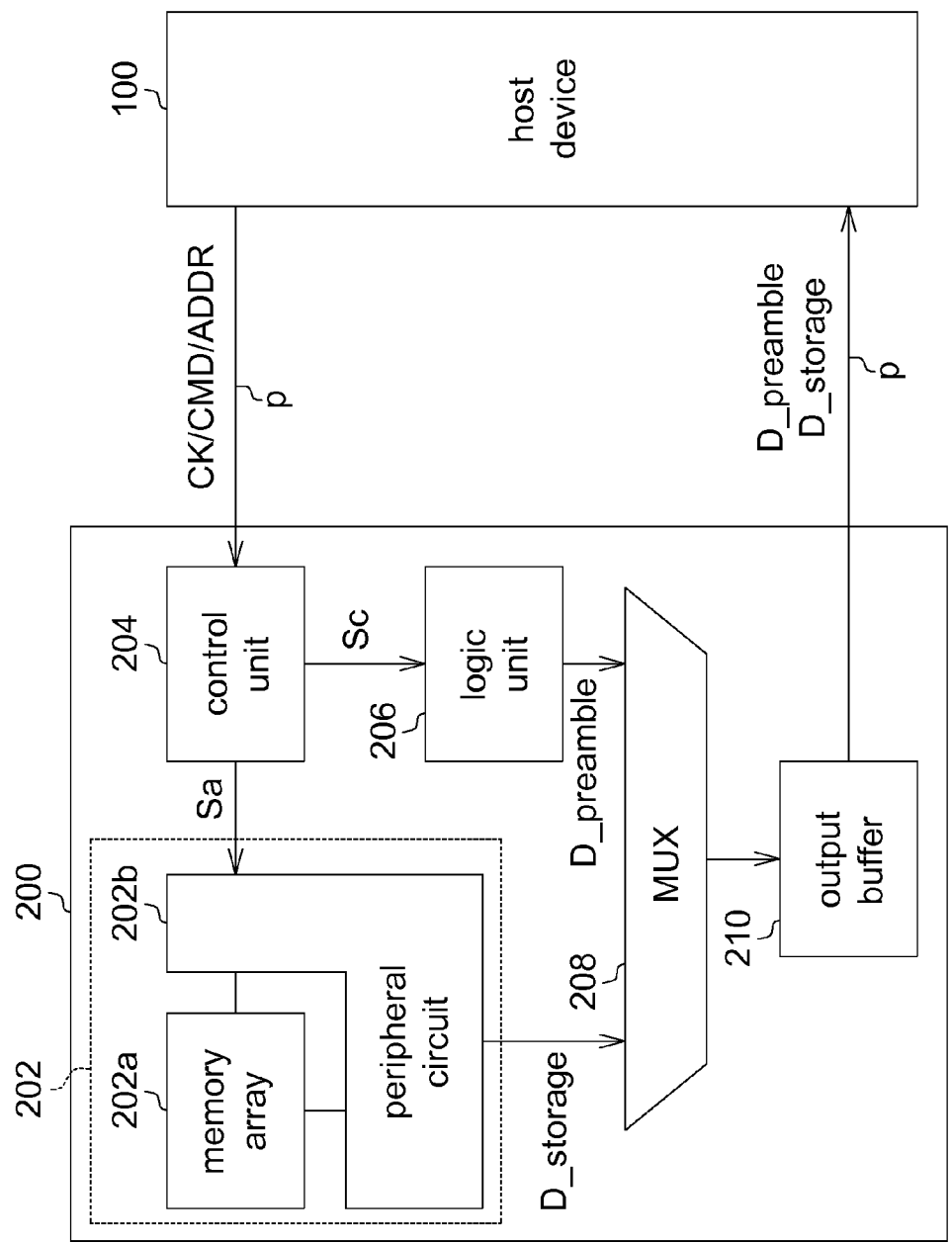
FIG. 1 is a block diagram of the memory apparatus according to the present embodiment of invention.
Figure 2:
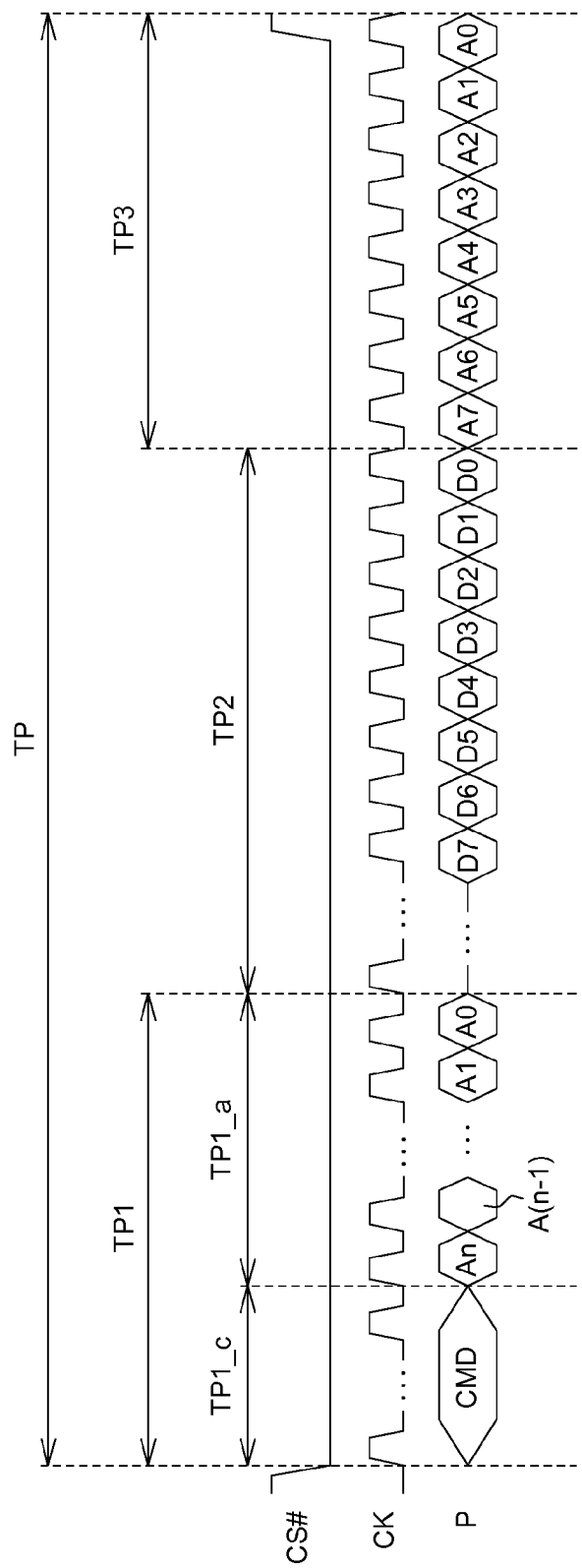
FIG. 2 is a timing diagram for memory apparatus shown in FIG. 1.

Referring to FIG. 1, a block diagram of the memory apparatus according to the present embodiment of invention is shown. The memory apparatus 1 operates in a read operation period TP, including a command sub-period TP1, a dummy sub-period TP2, and a data transmission sub-period TP3. The command sub-period TP1 further includes a command cycle TP1_c and an address cycle TP1_a. For example, an illustration of the sub-periods TP1 to TP3, the command and the address cycles TP1_c and TP1_a is provided in FIG. 2.

The memory apparatus 1 includes a host device 100 and a slave device 200. The host device 100 is coupled to the slave device 200 via a set of I/O pin P, and provides a command CMD, an operation address ADDR, and a clock signal CK to the slave device 200 via the set of I/O pin P, so as to have the slave device 200 configured to provide access data D. The host device 100 further receives the access data D, provided by the slave device 200, via the set of I/O pin P. As such, the slave device 200 can be properly accessed by the host device 100.

The host device 100 further stores a number of pieces of verification data, and provides the command CMD indicating one of the number of pieces of verification data. For example, each of the number of pieces of verification data includes 8 bits of data, each of which selectively corresponds to a logic value of one and a logic value of zero. In an embodiment, the command CMD is configured with a value of (00), and the corresponding verification data indicates the value of (10101010).

The slave device 200 includes a memory unit 202, a control unit 204, a logic unit 206, a multiplexer 208, and an output buffer 210, wherein the control unit 204 is connected to the memory unit 202 and the logic unit 206, and the memory unit 202 and the logic unit 206 are further coupled to the output buffer 210 via the multiplexer 208.

The control unit 204 receives the command CMD in the command sub-period TP1, and accordingly has the slave device 200 driven to operate in the dummy and the data transmission sub-periods TP2 and TP3. For example, the command CMD is a read command, and the control unit 204, in response to the read command, provides an access signal Sa to the memory unit 202 in the data transmission sub-period TP3, and further provides a control signal Sc to the logic unit 206 in the dummy sub-period TP2, wherein the control signal Sc is configured with the same value as the command CMD, i.e. (00), and accordingly indicates the verification data with the value of (10101010).

In other example, the control signal Sc is not provided by the command CMD together with the access signal Sa. In other example, the control signal Sc can also be provided by a status register, which is configured with different values in response to a status configuration command provided by the host device 100. As such, the control scheme of the control signal Sc can be achieved by configuring data value stored in the status register.

The memory unit 202 includes a memory array 202a and a peripheral circuit 202b. For example, the memory array 202a is a flash memory array, and the peripheral circuit 202b includes a word line decoder, a bit line decoder, and a sense amplifier, which operate in response to the access signal Sa to have the flash memory array biased and accordingly obtain storage data D_storage stored in selected cells of the memory unit 202 in the data transmission sub-period TP3. In other words, based on the access signal Sa, the memory unit provides the storage data D_storage in the data transmission sub-period TP3.

The logic unit 206 is driven to provide preamble data D_preamble in response to the control signal Sc in the dummy sub-period TP2, wherein the preamble data D_preamble indicate substantially the same data value as the verification data. In other words, the logic unit 206 is configured to provide the preamble data D_preamble indicating the data value of (10101010) in response to the control signal Sc indicating the signal value of (00).

Figures 3, 4:
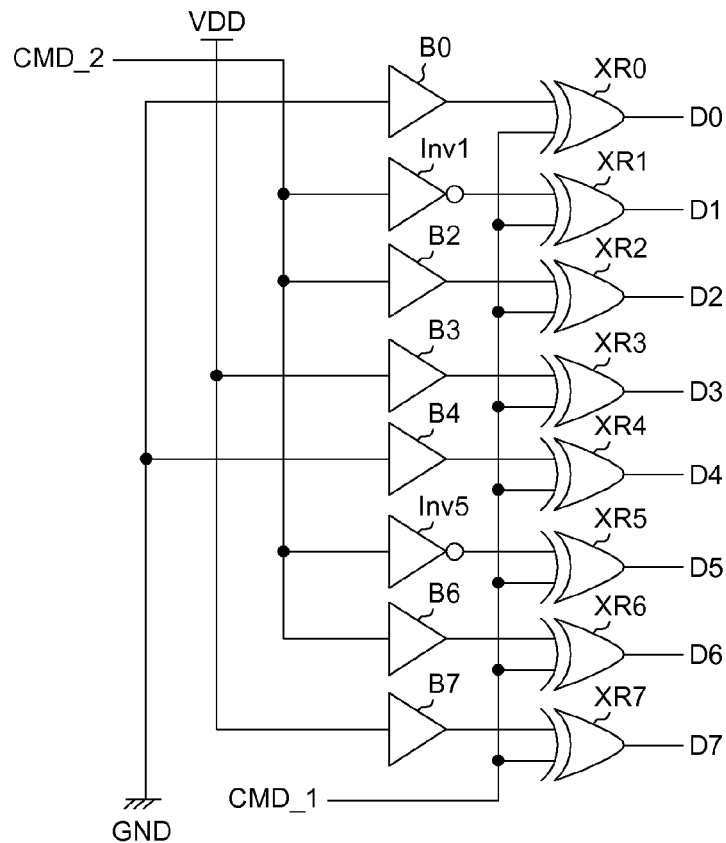
FIG. 3 is an illustration for the logic unit 206.
FIG. 4 is a truth table of the logic unit 206.

Referring to FIG. 3, an illustration for the logic unit 206 is shown. For example, the logic unit 206 includes exclusive OR gates XR1 to XR7, buffers B0, B2-B4, B6-B7, and inverters Inv1 and Inv5. The buffers B0 and B4 receive a ground reference voltage GND, the buffers B3 and B7 receive a supply reference voltage VDD, and the inverters Inv1, Inv5, the buffers B2 and B6 receives a command component CMD_2, i.e. the second bit of datum, corresponding to logic value of zero in the present embodiment of the invention, of the control signal Sc. One input ends of the exclusive OR gates XR1 to XR7 respectively receive output signals provided by the buffer B0, the inverter Inv1, the buffers B2-B4, the inverter Inv5, the buffers B6 and B7, and the other ones receives a command component CMD_1, i.e. the first bit of datum, corresponding to logic value of zero in the present embodiment of the invention, of the control signal Sc. As such, as the command CMD indicates the value of (00), the logic unit 206 accordingly provides the preamble data D_preamble indicating the data value of (10101010).

Referring to FIG. 4, a truth table of the logic unit 206 is shown. Based on similar rational, when the command CMD indicates other values, such as (01), (10), and (11), the logic unit 206 accordingly provides the preamble data D_preamble data respectively indicating the data values of (11001100), (01010101), and (00110011).

Referring back to FIGS. 1 and 2. The multiplexer 208 and the output buffer 210 substantially form an output unit for receiving the preamble data D_preamble and the storage data D_storage. The output unit further respectively outputs the preamble data D_preamble in the dummy sub-period TP2 and outputs the storage data D_storage in the data transmission sub-period TP3, wherein the transmission of the preamble data D_preamble and the storage data D_storage is achieved according to an internal clock signal CK. As such, the set of I/O pin P corresponds to the waveform shown in FIG. 2.

The host device 100 samples the preamble data D_preamble according to an external clock signal. The host device 100 further determines whether the external clock signal is substantially aligned with data valid-intervals, determined by the internal clock signal CK, by comparing the obtained preamble data D_preamble and the verification data. For example, the data valid-intervals are the periods of time that each bit datum of the preamble data D_preamble is transmitted. In other words, the host device 100 determines whether the external and the internal clock signals are substantially synchronized by determining whether the data value of the preamble data D_preamble, transmitted based on the internal clock signal CK while sampled with the external clock signal, is substantially the same as the verification data.

When the preamble data D_preamble substantially correspond to the verification data, the host device 100 obtains a determination indicating that the external clock signal is substantially aligned with the data valid intervals of the internal clock signal CK, and the external and the internal clock signals are substantially synchronized.

On the other hand, when the first preamble data D_preamble does not completely correspond to the first verification data, the host device 100 obtains a determination indicating that the external clock signal is not aligned with the data valid intervals of the internal clock signal CK, and the external and the internal clock signals are not synchronized. The host device 100 further adjusts a trigger edge of the external clock signal based on the determination, so as to achieve clock timing synchronization of the external clock signal in the dummy sub-period TP2.

Though only the situation that the command CMD is configured with a value of (00) and the corresponding verification data indicates the value of (10101010) has been illustrated in the present embodiment of the invention, the memory apparatus 1 is not limited thereto. In other embodiment, the command CMD can also be configured with other values, such as (01), (10), and (11), and the corresponding verification data accordingly indicate the values of (11001100), (01010101), and (00110011), and the logic unit 206 can still obtain the preamble data D_preamble, having substantially the same data values as the aforementioned values of the verification data. As such, similar determination operation of whether the external and the internal clock signals are synchronized can also be achieved with the verification data and the preamble data D_preamble are configured with other data values.

Though only the situation that the verification data and the preamble data D_preamble selectively correspond to any one of the values of (10101010), (11001100), (01010101), and (00110011) has been illustrated in the present embodiment of the invention, the memory apparatus 1 is not limited thereto. In other example, other data values, such as (00000001), (11111110), or any other kinds of bit datum patterns can also be designated as the verification data and the preamble data D_preamble.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory apparatus, operating in a first read operation period, including a first command sub-period, a first dummy sub-period, and a first data transmission sub-period, the memory apparatus comprising:
   a host device, storing first verification data, and providing a first command indicating the first verification data; and
   a slave device, comprising:
   a memory unit;
   a control unit, receiving the first command in the first command sub-period, driving the memory unit to provide first storage data in the first data transmission sub-period, and further providing a first control signal in the first dummy sub-period, the first control signal indicating the first verification data;
   a logic unit, providing first preamble data, indicating substantially a same data value as the first verification data, in the first dummy sub-period in response to the first control signal; and
   an output unit, receiving the first preamble data and the first storage data, and further outputting the first preamble data and the first storage data according to an internal clock signal, wherein
   the host device samples the first preamble data according to an external clock signal, and determines whether the external clock signal is substantially aligned with data valid-intervals determined by the internal clock signal by comparing the first preamble data and the first verification data.

2. The memory apparatus according to claim 1, wherein when the first preamble data substantially correspond to the first verification data, the host device obtains a determination indicating that the external clock signal is substantially aligned with the data valid intervals.

3. The memory apparatus according to claim 1, wherein when the first preamble data does not completely correspond to the first verification data, the host device obtains a determination indicating that the external clock signal is not substantially aligned with the data valid intervals.

4. The memory apparatus according to claim 3, wherein the host device further adjusts a trigger edge of the external clock signal based on the determination, so as to achieve clock timing synchronization of the external clock signal in the first dummy sub-period.

5. The memory apparatus according to claim 1, further operating in a second read operation period, including a second command sub-period, a second dummy sub-period, and a second data transmission sub-period, wherein the host device further stores second verification data, and is configured to selectively provide a second command indicating the second verification data.

6. The memory apparatus according to claim 5, wherein the control unit further receives the second command in the second command sub-period, drives the memory unit to provide second storage data in the second data transmission sub-period, and further provides a second control signal in the second dummy sub-period, the second control signal indicating the second verification data;
   the logic unit further provides second preamble data, indicating substantially a same data value as the second verification data, in the second dummy sub-period in response to the second control signal; and
   the output unit further receives the second preamble data and the second storage data, and further outputs the second preamble data and the second storage data according to the internal clock signal.

7. The memory apparatus according to claim 6, wherein the first and the second control signals are provided by a status register, which is configured with different values, indicating the respective first and the second control signals, in response to a register configuration command.

8. The memory apparatus according to claim 6, wherein the host device samples the second preamble data according to the external clock signal, and determines whether the external clock signal is substantially aligned with data valid-intervals determined by the internal clock signal by comparing the second preamble data and the second verification data.

9. The memory apparatus according to claim 8, wherein one of the first and the second preamble data correspond to a data pattern, in which multiple sequential logic values of zero and a logic value of one are included.

10. The memory apparatus according to claim 8, wherein one of the first and the second preamble data correspond to a data pattern in which multiple sequential logic values of one and a logic value of zero are included.

11. A memory access method, applied in a memory apparatus, which operates in a first read operation period, including a first command sub-period, a first dummy sub-period, and a first data transmission sub-period, a host device of the memory apparatus storing first verification data and providing a first command indicating the first verification data the memory access method comprising:
   receiving the first command in the first command sub-period by a control unit of a slave device;
   driving a memory unit of the slave device to provide first storage data in the first data transmission sub-period by the control unit;
   providing a first control signal, indicating the first verification data, in the first dummy sub-period, by the control unit;
   providing first preamble data, indicating substantially a same data value as the first verification data, in the first dummy sub-period in response to the first control signal, by a logic unit of the slave device;
   receiving the first preamble data and the first storage data, and further outputting the first preamble data and the first storage data according to an internal clock signal, by an output unit of the slave device; and
   sampling the first preamble data according to an external clock signal, and determining whether the external clock signal is substantially aligned with data valid-intervals determined by the internal clock signal by comparing the first preamble data and the first verification data, by the host device.

12. The memory access method according to claim 11, further comprising:
   when the first preamble data substantially correspond to the first verification data, obtaining a determination indicating that the external clock signal is substantially aligned with the data valid intervals, by the host device.

13. The memory access method according to claim 11, further comprising:
   when the first preamble data does not completely correspond to the first verification data, obtaining a determination indicating that the external clock signal is not substantially aligned with the data valid intervals, by the host device.

14. The memory access method according to claim 13, further comprising:

adjusting a trigger edge of the external clock signal based on the determination, so as to achieve clock timing synchronization of the external clock signal in the first dummy sub-period, by the host device.

15. The memory access method according to claim 11, wherein the memory apparatus further operates in a second read operation period, including a second command sub-period, a second dummy sub-period, and a second data transmission sub-period, and the host device further stores second verification data and is configured to selectively providing a second command indicating the second verification data.

16. The memory access method according to claim 15, further comprising:
    receiving the second command in the second command sub-period by the control unit;
    driving the memory unit to provide second storage data in the second data transmission sub-period, by the control unit;
    providing a second control signal in the second dummy sub-period, the second control signal indicating the second verification data, by the control unit;
    providing second preamble data, indicating substantially a same data value as the second verification data, in the second dummy sub-period in response to the second control signal, by the logic unit;
    receiving the second preamble data and the second storage data, and further outputting the second preamble data and the second storage data according to the internal clock signal, by the output unit.

17. The memory access method according to claim 16, wherein the first and the second control signals are provided by a status register, which is configured with different values, indicating the respective first and the second control signals, in response to a register configuration command.

18. The memory access method according to claim 16, further comprising:
    sampling the second preamble data according to the external clock signal, and determining whether the external clock signal is substantially aligned with data valid-intervals determined by the internal clock signal by comparing the second preamble data and the second verification data, by the host device.

19. The memory access method according to claim 18, wherein one of the first and the second preamble data correspond to a data pattern, in which multiple sequential logic values of zero and a logic value of one are included.

20. The memory access method according to claim 18, wherein one of the first and the second preamble data correspond to a data pattern in which multiple sequential logic values of one and a logic value of zero are included.

* * * * *